(12) United States Patent
Lee et al.

(10) Patent No.: US 8,252,647 B2
(45) Date of Patent: Aug. 28, 2012

(54) FABRICATION OF TRENCH DMOS DEVICE HAVING THICK BOTTOM SHIELDING OXIDE

(75) Inventors: Yeeheng Lee, San Jose, CA (US); Sung-Shan Tai, San Jose, CA (US); Hong Chang, Saratoga, CA (US); John Chen, Palo Alto, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 443 days.

(21) Appl. No.: 12/551,417

(22) Filed: Aug. 31, 2009

(65) Prior Publication Data

US 2011/0049618 A1    Mar. 3, 2011

(51) Int. Cl.
*H01L 21/336* (2006.01)
(52) U.S. Cl. ........ 438/270; 438/259; 438/268; 438/142; 438/197; 257/E29.26; 257/E29.257
(58) Field of Classification Search .................. 438/142, 438/197, 259, 268, 270; 257/E29.26, E29.257
See application file for complete search history.

(56) References Cited

U.S. PATENT DOCUMENTS

| 4,914,058 | A | 4/1990 | Blanchard |
| 4,941,026 | A | 7/1990 | Temple |
| 7,863,995 | B2 | 1/2011 | Ho |
| 2008/0310065 | A1 | 12/2008 | Ho |

*Primary Examiner* — Samuel Gebremariam
(74) *Attorney, Agent, or Firm* — Joshua D. Isenberg; JDI Patent

(57) ABSTRACT

Semiconductor device fabrication method and devices are disclosed. A device may be fabricated by forming in a semiconductor layer; filling the trench with an insulating material; removing selected portions of the insulating material leaving a portion of the insulating material in a bottom portion of the trench; forming one or more spacers on one or more sidewalls of a remaining portion of the trench; anisotropically etching the insulating material in the bottom portion of the trench using the spacers as a mask to form a trench in the insulator; removing the spacers; and filling the trench in the insulator with a conductive material. Alternatively, an oxide-nitride-oxide (ONO) structure may be formed on a sidewall and at a bottom of the trench and one or more conductive structures may be formed in a portion of the trench not occupied by the ONO structure.

14 Claims, 20 Drawing Sheets

FABRICATION OF TRENCH DMOS DEVICE HAVING THICK BOTTOM SHIELDING OXIDE

FIELD OF THE INVENTION

This invention generally relates to the methods for fabricating a trench DMOS and more particularly to the methods for fabricating a trench DMOS with variable-thickness gate oxides.

BACKGROUND OF THE INVENTION

A DMOS (Double diffused MOS) transistor is a type of MOSFET (Metal Oxide Semiconductor Field Effect Transistor) that uses two sequential diffusion steps aligned to a common edge to form a channel region of the transistor. DMOS transistors are often high voltage, high current devices, used either as discrete transistors or as components in power integrated circuits. DMOS transistors can provide high current per unit area with a low forward voltage drop.

One particular type of DMOS transistor is a so-called trench DMOS transistor in which the channel is present on the sidewall of a trench, with the gate formed in the trench, which extends from the source towards the drain. The trench, which is lined with a thin oxide layer and filled with polysilicon, allows less constricted current flow than the planar vertical DMOS transistor structure and thereby provides lower values of specific on-resistance.

There exists a need to easily fabricate a trench DMOS transistor with variable-thickness gate trench oxides strategically placed at different portions inside the trench to maximize device performance. For example, a thinner gate oxide is preferred at the upper portion of the trench to maximize channel current. By contrast, a thicker gate oxide is desired at the bottom portion of trench to support higher gate-to-drain breakdown voltage.

U.S. Pat. No. 4,941,026 discloses a vertical channel semiconductor device including an insulated gate electrode having a variable thickness oxide, but does not illustrate how to make such a device.

U.S. Pat. No. 4,914,058 discloses a process for making a DMOS, including lining a groove with a nitride to etch an inner groove having sidewalls extending through the bottom of the first groove, and lining the inner groove with a dielectric material by oxidation growth to obtain increased thickness of the gate trench dielectric on the sidewalls of the inner groove.

US publication No. 2008/0310065 discloses a transient voltage suppressing (TVS) circuit with uni-directional blocking and symmetric bi-directional blocking capabilities integrated with an electromagnetic interference (EMI) filter supported on a semiconductor substrate of a first conductivity type. The TVS circuit integrated with the EMI filter further includes a ground terminal disposed on the surface for the symmetric bi-directional blocking structure and at the bottom of the semiconductor substrate for the uni-directional blocking structure and an input and an output terminal disposed on a top surface with at least a Zener diode and a plurality of capacitors disposed in the semiconductor substrate to couple the ground terminal to the input and output terminals with a direct capacitive coupling without an intermediate floating body region. The capacitors are disposed in trenches having an oxide and nitride lining.

A difficulty arises during polysilicon gate backfill in the trench if a thick oxide is uniformly formed in the trench, producing a higher trench aspect ratio (ratio of depth A to width B) as shown in the prior art. By way of example, FIGS. 1A-1D are cross-sectional views illustrating a prior art method of forming a single gate of the prior art. As shown in FIG. 1A, a trench 106 is formed in a semiconductor layer 102. A thick oxide 104 is formed on the bottom and sidewalls of the trench 106 which increases its aspect ratio A/B. Polysilicon 108 is in-situ deposited into the trench 106. Due to the high aspect ratio of the polysilicon deposition, a keyhole 110 tends to form as shown in FIG. 1B. As shown in FIG. 1C, the poly 108 is etched back followed with an isotropic high temperature oxidation (HTO) oxide etch as shown in FIG. 1D, throughout which a portion of the keyhole 110 remains.

FIG. 2 is a cross-sectional view of a current shield gate trench (SGT) device 200 having a shield poly gate with an Inter-Poly Oxide (IPO) 202 between a first polysilicon structure that forms a gate 204 and a second polysilicon structure 206 that acts as a conductive shield. According to one prior art process, such a structure is formed by a process that involves two etch-back steps (of the polysilicon layer 206 and of the IPO oxide layer 202) in forming the IPO 202 between the two polysilicon structures 204, 206. Specifically, the polysilicon that forms the shield 206 is deposited in the trench and etched back and HDP oxide is formed on the shield 206 and etched back to make room for deposition of the polysilicon that forms the gate structure 204. This approach has the drawback of poor IPO thickness controllability across wafer. The IPO thickness depends on two independent and unrelated etch-back steps, which could cause non-uniform and local thinning of IPO thickness due to either under etch-back of Poly or over etch-back of Oxide or a combination of both.

Also, in the methods discussed above the thickness of the gate trench dielectric on the thick portion of the side wall versus the thickness at the bottom of the trench are linked together. One thickness cannot be altered without affecting the other thickness.

It is within this context that embodiments of the present invention arise.

DESCRIPTION OF THE SPECIFIC EMBODIMENTS

In embodiments of the present invention the bottom and the sidewall thickness of a trench gate are decoupled during fabrication. A thicker bottom reduces capacitance between the gate and the drain of the DMOS transistors.

Figure 1A:
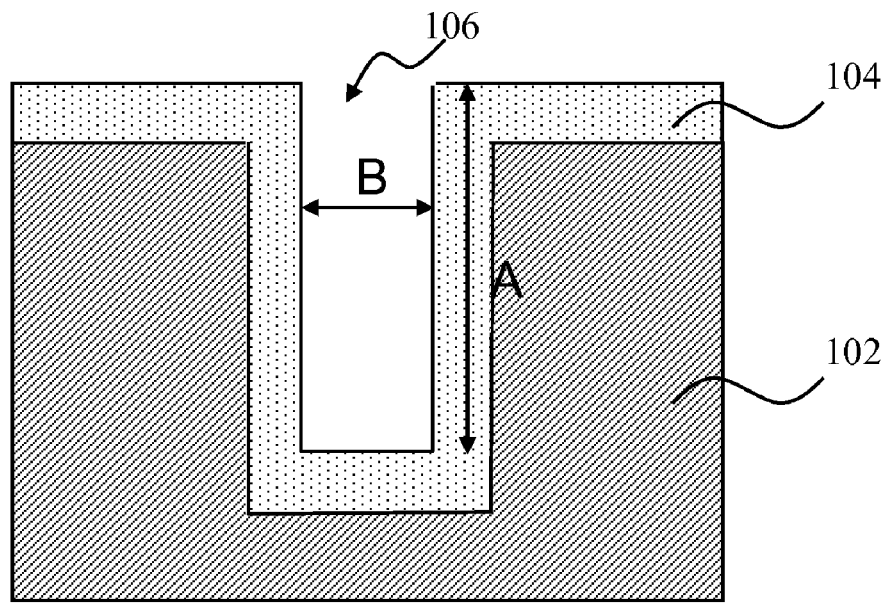
FIGS. 1A-1D are cross-sectional schematic diagrams illustrating trench gate fabrication according to the prior art.
Figure 1B:
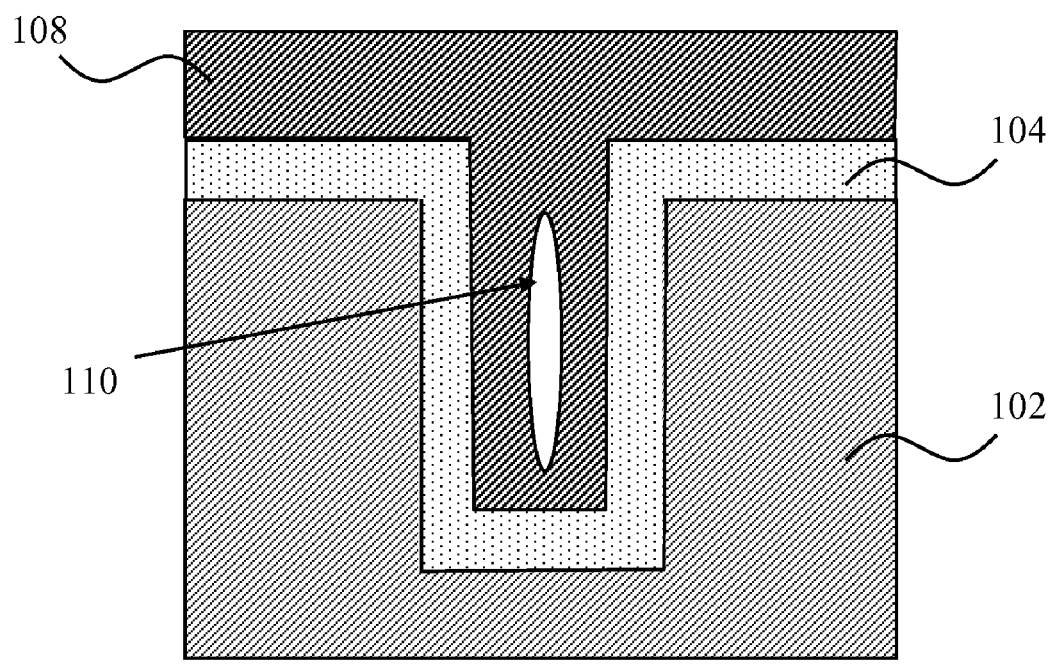
Figure 1C:
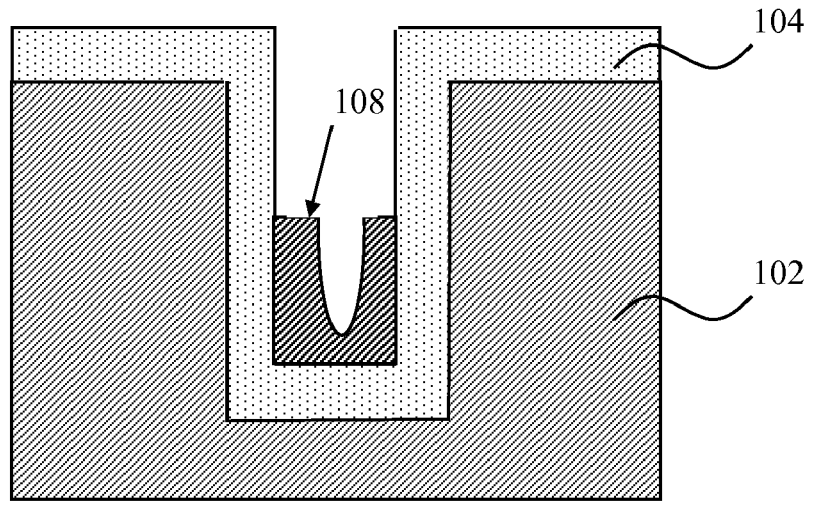
Figure 1D:
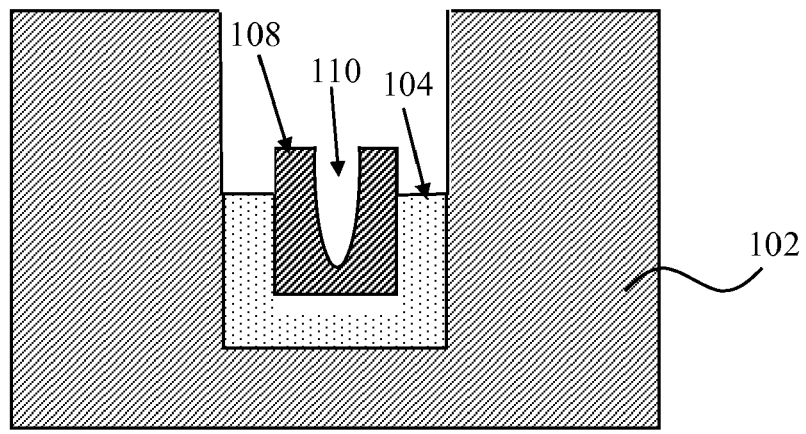
Figure 3A:
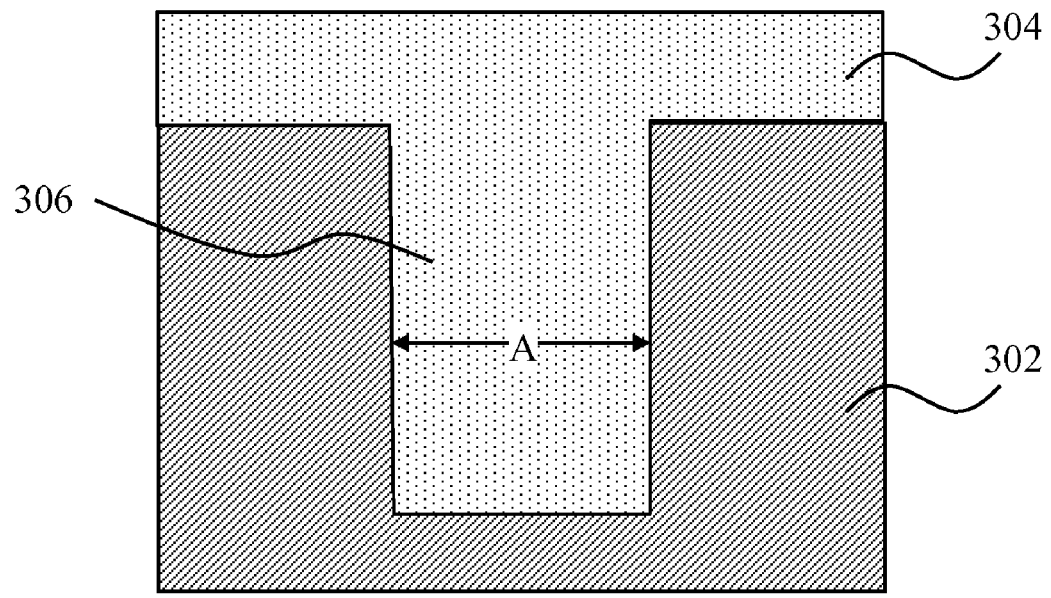
FIGS. 3A-3O are cross-sectional views illustrating a process of fabricating a trench DMOS with variable-thickness gate trench oxides for single poly gate case according to an embodiment of the present invention.
Figure 3B:
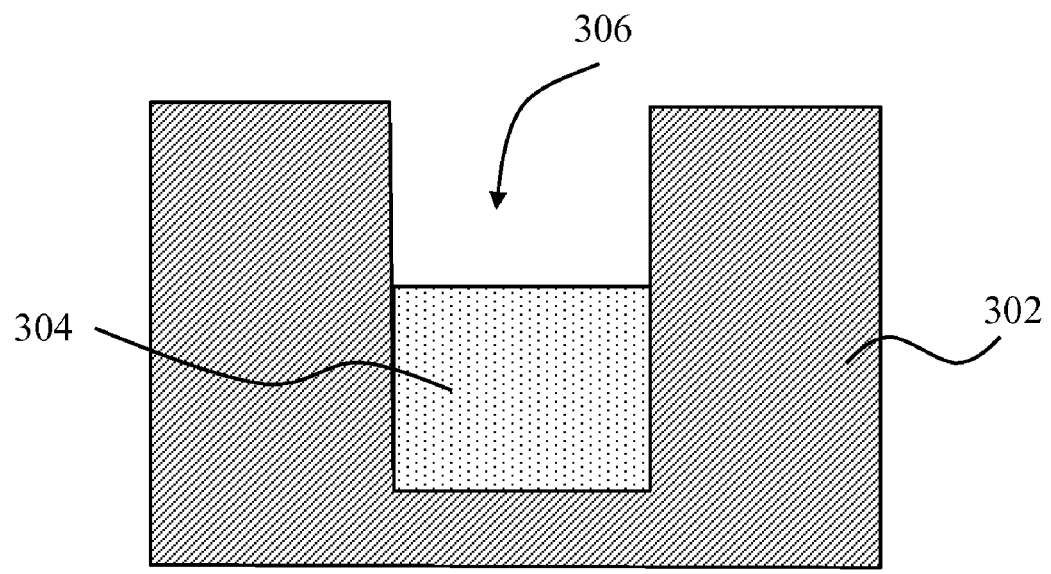
Figure 3C:
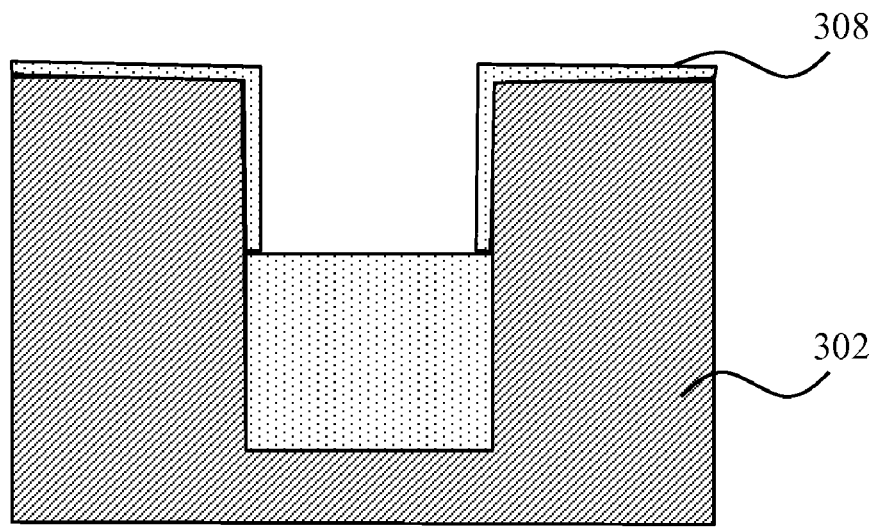
Figure 3D:
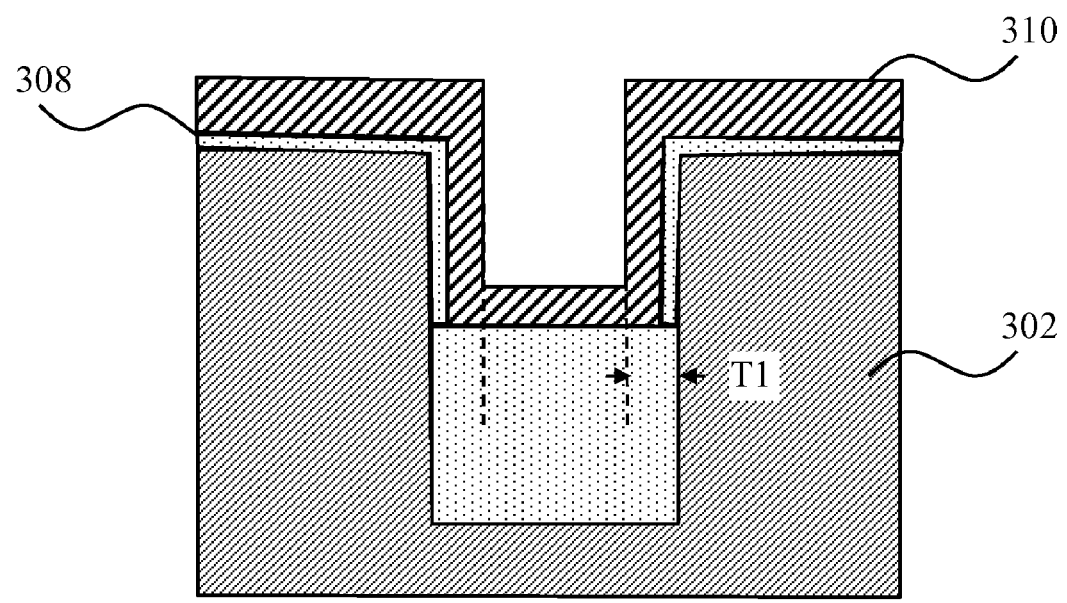
Figure 3E:
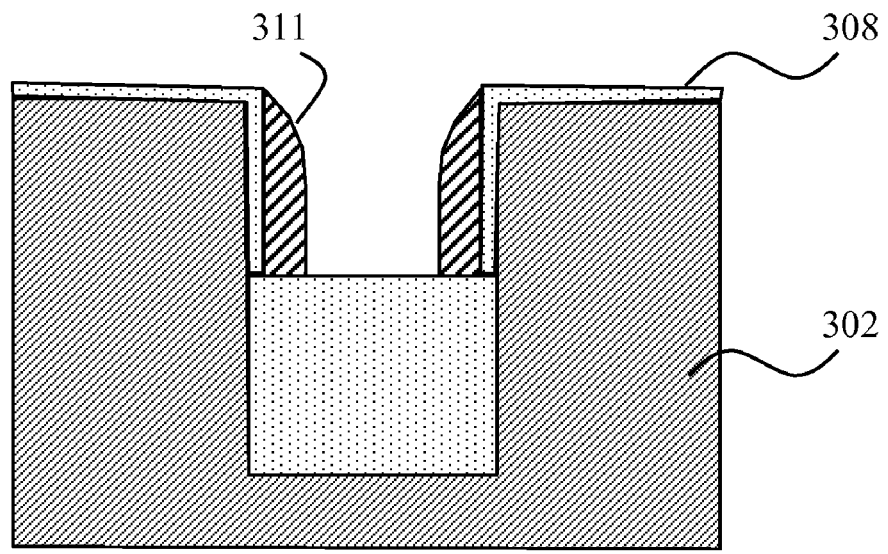
Figure 3F:
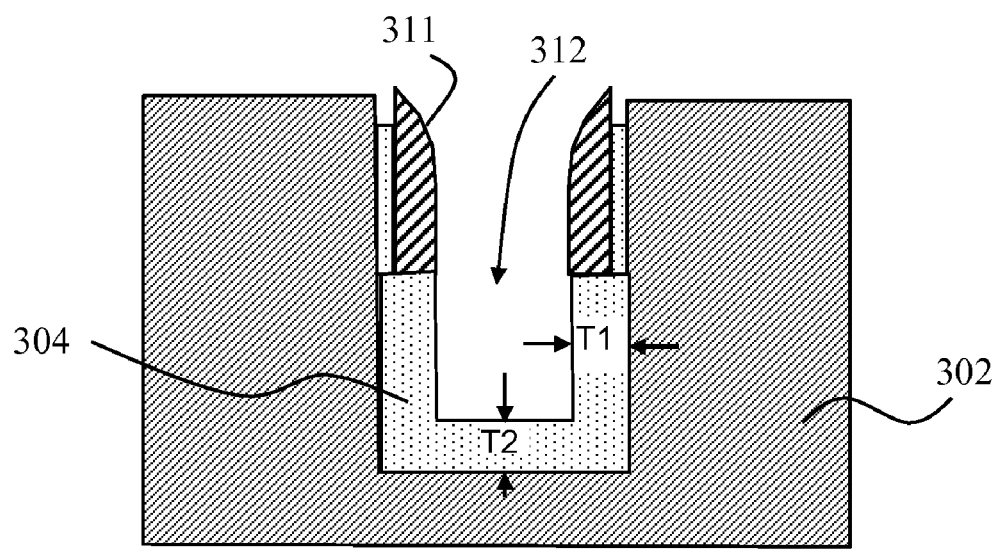
Figure 3G:
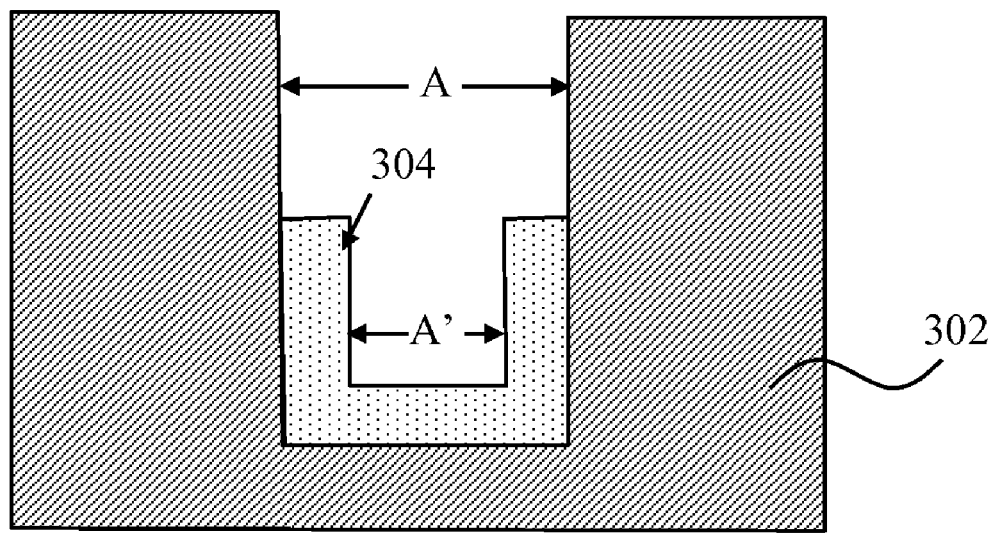
Figure 3H:
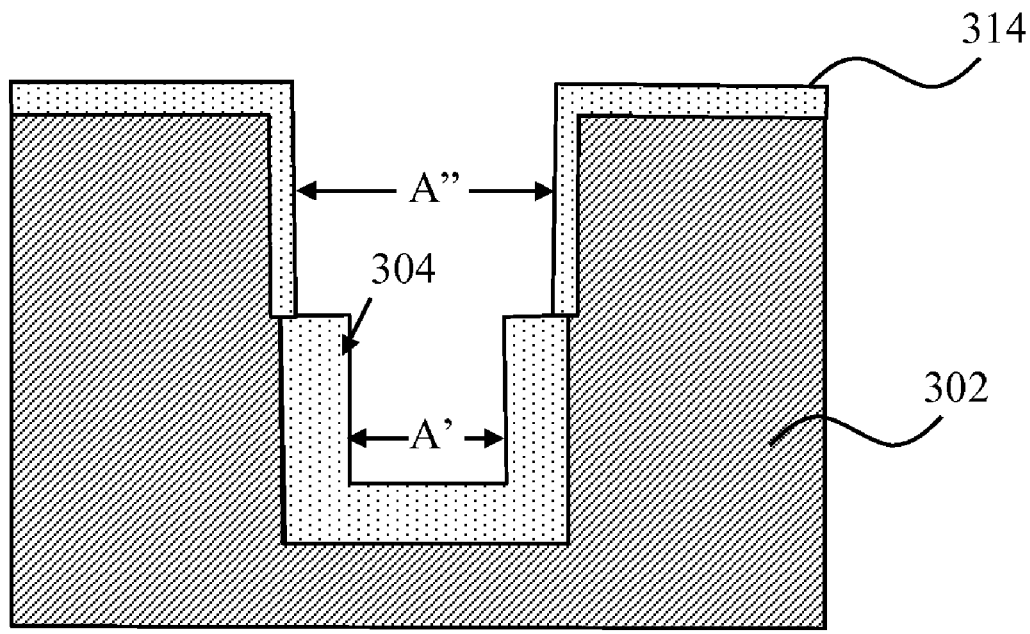
Figure 3I:
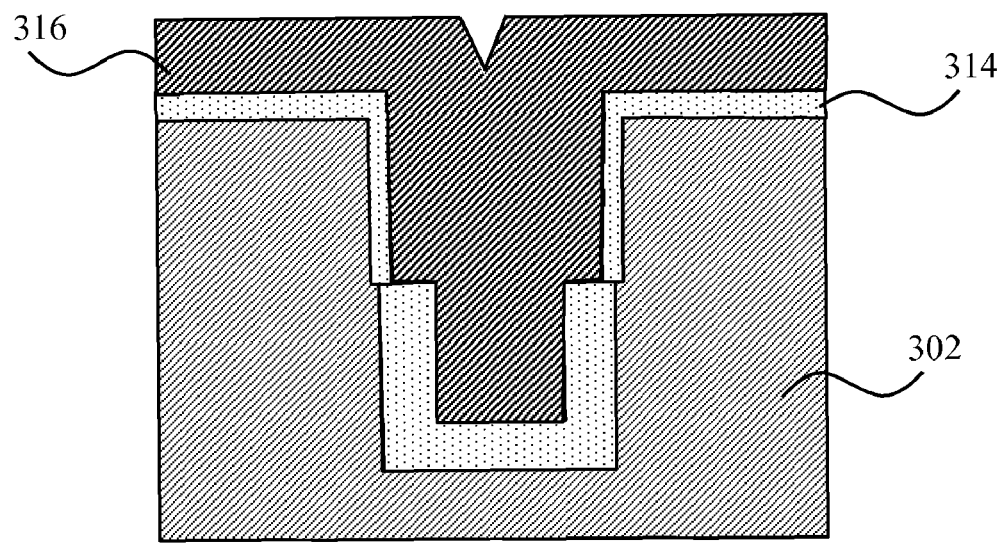
Figure 3J:
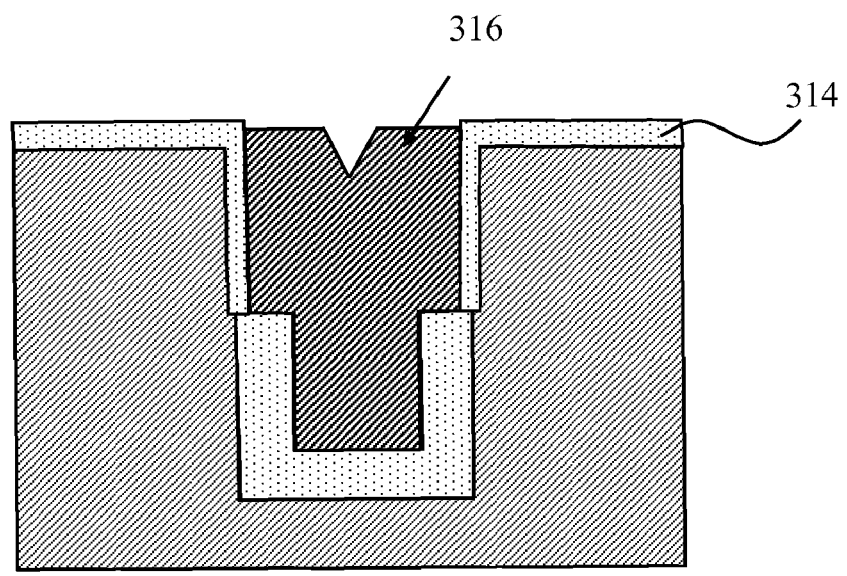
Figure 3K:
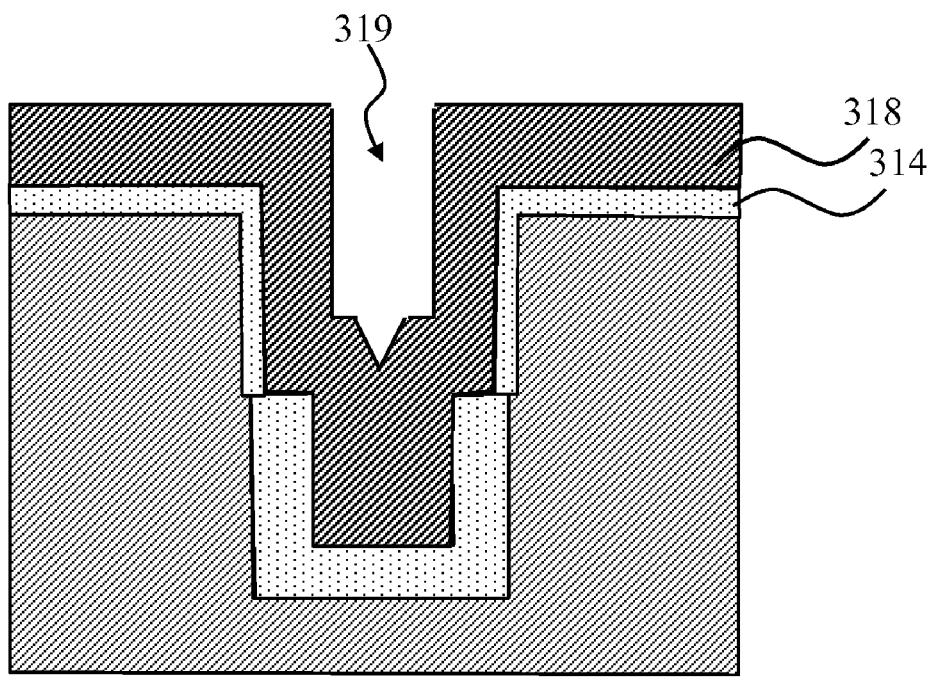
Figure 3L:
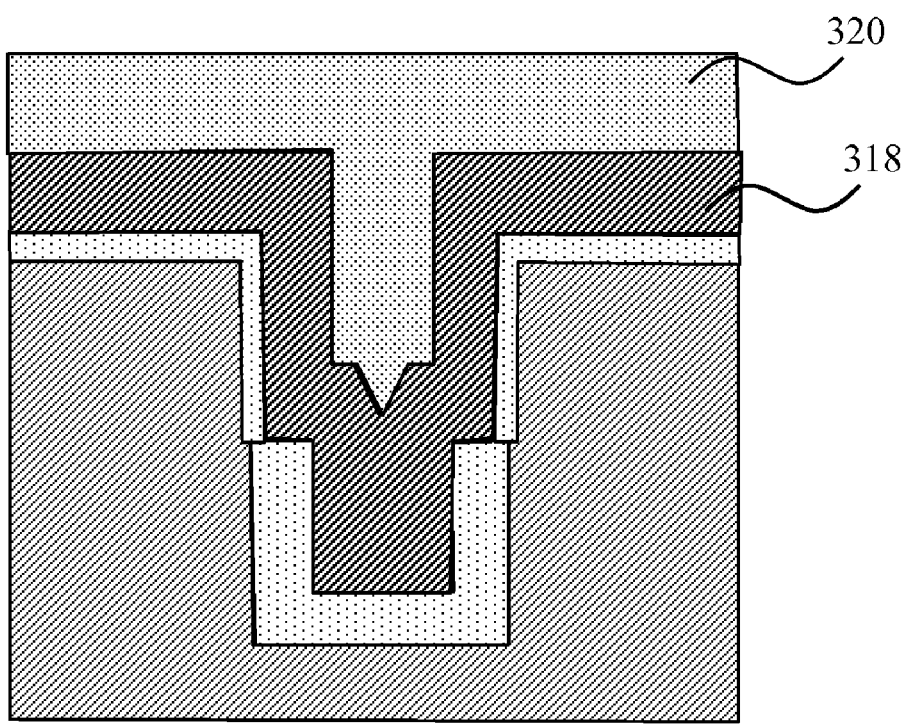
Figure 3M:
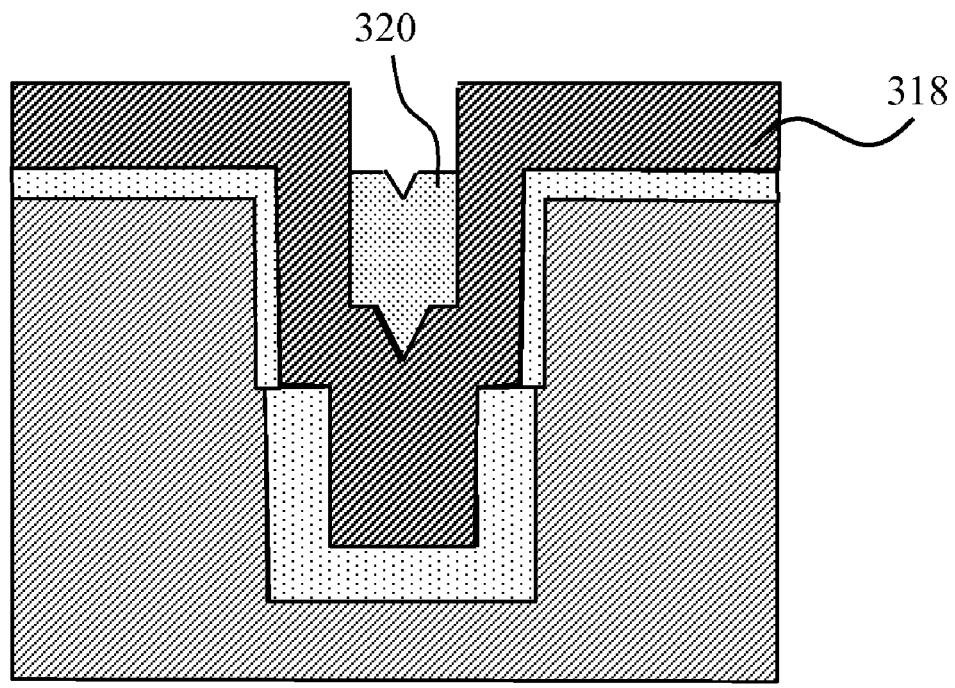
Figure 3N:
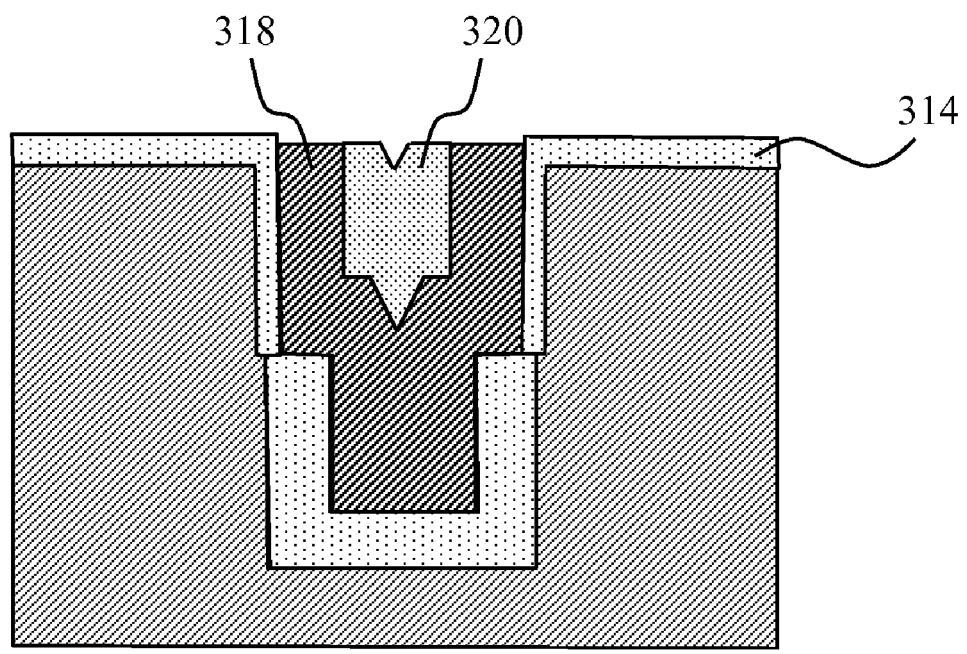
Figure 3O:
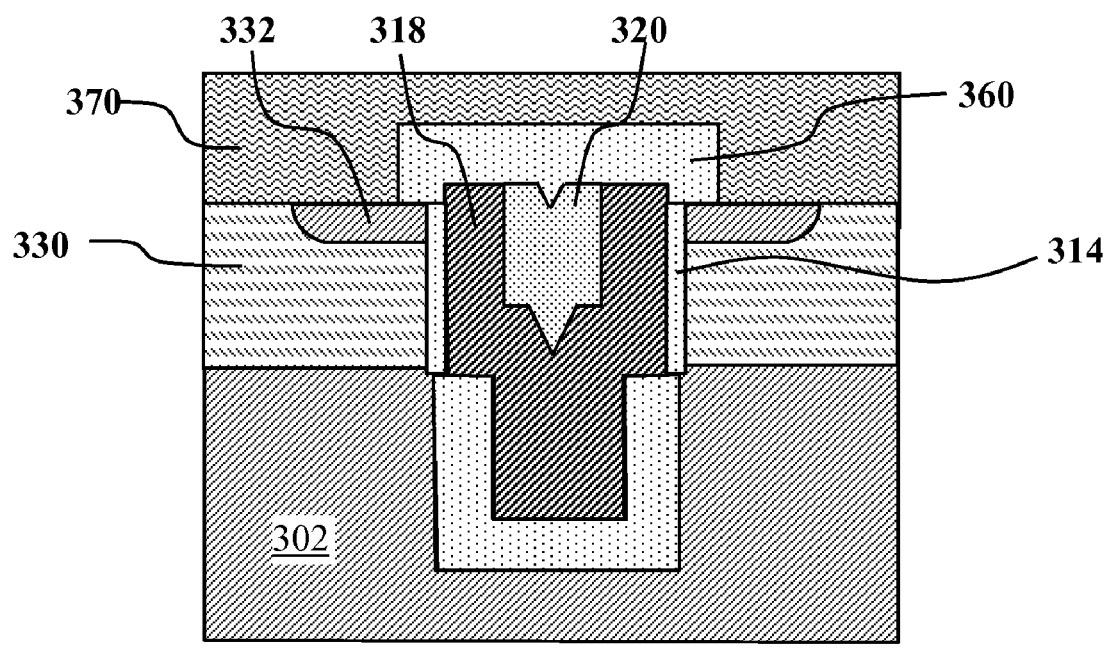

FIGS. 3A-3N are cross-sectional views illustrating a process of fabricating a trench DMOS with variable-thickness trench gate oxides for a single polysilicon (poly) gate of the type depicted in FIG. 1D according to an embodiment of the present invention.

As shown in FIG. 3A, a trench 306 of width A is formed in a semiconductor layer 302. By way of example and not by way of limitation, the trench 306 may be formed using a hard mask, e.g., oxide or nitride, which may then be removed or left in place, or simply using a photoresist (PR) mask. An oxide 304 (or other insulator) is deposited to fill the trench 306. A chemical mechanical planarization (CMP) may be performed on the oxide 304 followed by an etchback to recess the oxide 304 in the trench 306 as shown in FIG. 3B, leaving an thick block of the oxide 304 substantially filling the lower portion of the trench and exposing the silicon sidewall of upper portion of the trench. A thin oxide 308 may then be grown on the exposed sidewall of the trench 306 and on an exposed surface of the semiconductor layer 302 as shown in FIG. 3C. By way of example, and not by way of limitation, the thickness of the thin oxide 308 may be between about 50 Angstroms and 100 Angstroms.

A layer of oxide etch resistant material, such as nitride 310 is then deposited on top of the oxide 308 and the oxide 304 as shown in FIG. 3D. By way of example, the nitride 310 may include silicon nitride. Alternatively, polysilicon may be used as the oxide etch resistant material 310 since it also has high etch resistance during subsequent oxide etch. The thickness of the nitride 310 determines the bottom oxide sidewall thickness T1, which may be between about 500 angstroms (Å) and about 5000 Å. The nitride 310 is then anisotropically etched back leaving one or more oxide etch resistant spacers 311 on the sidewall of the trench 306 as shown in FIG. 3E. The thick oxide block 304 may then be anisotropically etched to a predetermined thickness T2 at the bottom of the trench 306 as shown in FIG. 3F. The thickness T2 may be between about 500 Å and about 5000 Å. The material, e.g., nitride, that forms the spacer(s) 311 is preferably resistant to the process used to etch the oxide 304. The spacer(s) 311 therefore act as an etch mask to define a width A' of a trench etched into the oxide 304. In this method, the thicknesses T1 and T2 are decoupled, i.e., the thickness T1 does not depend on the thickness T2. In general, it is desirable for T2 to be greater than T1. This may be accomplished more easily if the thicknesses T1 and T2 are decoupled. After etching, the spacers 311 and thin oxide 308 may be removed leaving behind a trench with a top portion of width A and a narrower bottom portion of width A' lined by the remaining portion of oxide 304 as shown in FIG. 3G.

Gate oxide (or dielectric) 314 may then be grown on top of the semiconductor layer 302 and on portions of the sidewall of the trench that are not covered by the remaining oxide 304 leaving the top portion with a width A" that is greater than the width A' of the bottom portion as shown in FIG. 3H. The trench "aspect ratio" is effectively reduced for easier filling due to the wide trench top portion having width A". Conductive material, such as doped polysilicon may then be deposited to fill the trench. FIG. 3I shows the polysilicon gap fill 316 in a narrow trench case, e.g., where the width A" at the top of the trench is about 1.2 microns, where the doped polysilicon can easily fill up the trench completely. The polysilicon 316 is then etched back to form a single gate poly as shown in FIG. 3J. The polysilicon 316 acts with the gate dielectric 314 as the gate electrode for the device.

Alternatively, FIG. 3K shows the poly gap fill 318 in the wider trench case, e.g., the diameter A" at the top of the trench is about 3 microns, where poly cannot easily fill up completely, which leaves a gap 319. A filler material, such as an HDP oxide 320, may then be deposited to fill the gap 319 and on top of the poly 318 as shown in FIG. 3L. The filler material 320 may then be etched back as shown in FIG. 3M followed by an etching back of the poly 318 and filler material 320 to form a single gate poly 318 as shown in FIG. 3N. The device may be completed by a standard process e.g., involving ion implant into selected portions of the semiconductor layer 302 to form a body region 330 and source regions 332, followed by the formation of a thick dielectric layer 360 on top of the surface and open contact holes through dielectric layer 360 for depositing a source metal 370 to electrically connect to the source and body regions.

There are a number of variations on the process described above that are within the scope of embodiments of the present invention. For example, FIGS. 4A-4L illustrate a process to fabricate a trench DMOS with variable-thickness gate trench oxides for a shield poly gate of the type depicted in FIG. 2 according to an embodiment of the present invention. In this embodiment, a composite insulator in the form of an oxide-nitride-oxide (ONO) structure is formed on the sidewall and the bottom of the trench.

Figure 4A:
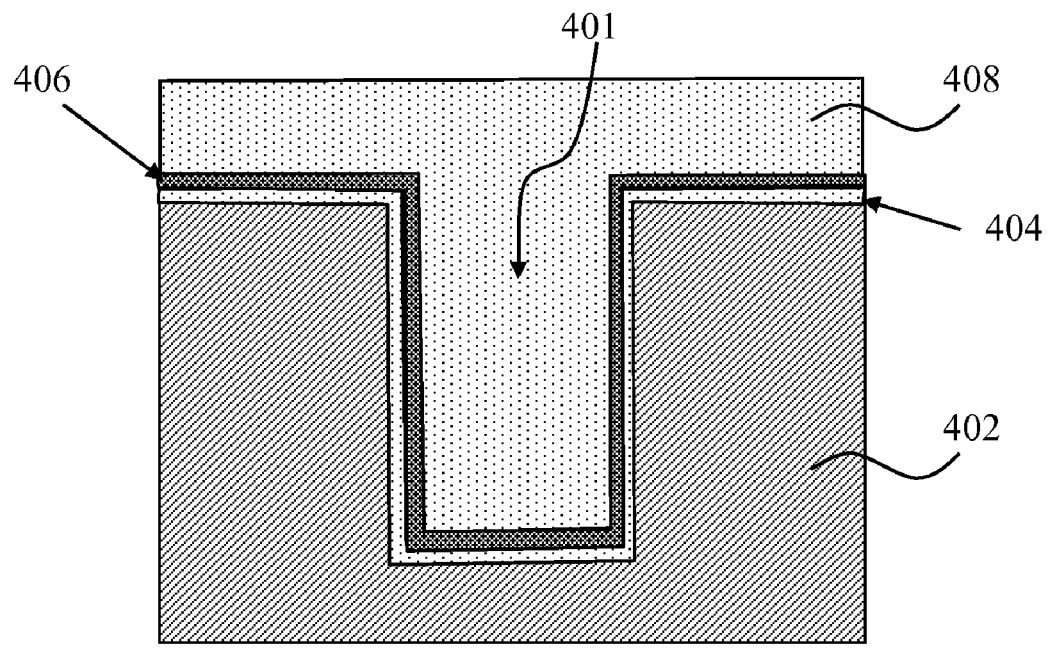
FIGS. 4A-4M are cross-sectional views illustrating a process of fabricating a trench DMOS with variable-thickness gate trench oxides for shield poly gate case according to an embodiment of the present invention.
Figure 4B:
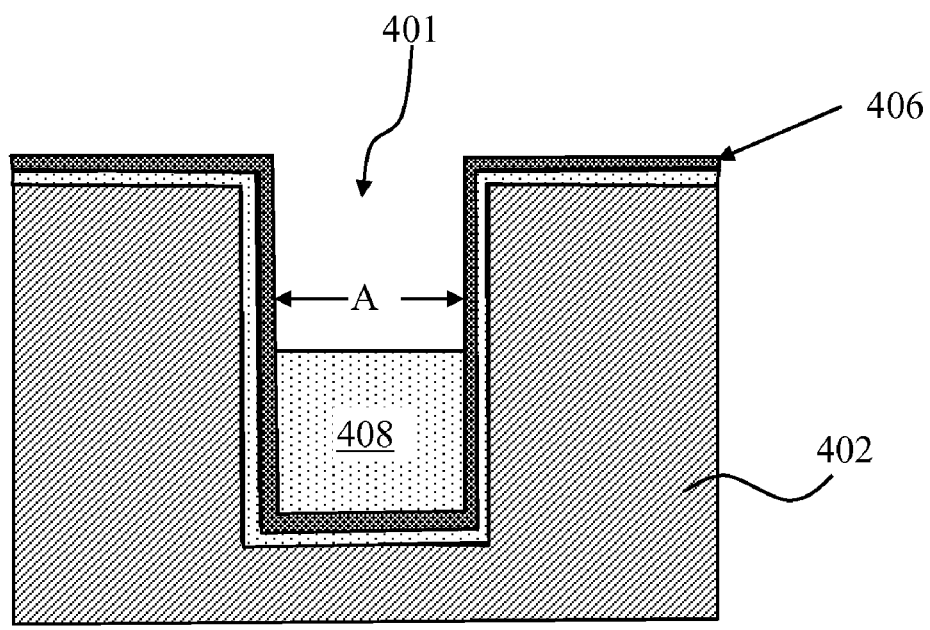

As shown in FIG. 4A, a trench 401 is first formed in a semiconductor layer 402. A thin oxide layer 404 is formed on the sidewall of the trench 401. The thickness of the oxide layer 404 may be between about 50 Angstroms and 200 Angstroms. Nitride 406 is then deposited on top of the oxide layer 404. Thickness of the nitride layer 406 may be between about 50 Angstroms and 500 Angstroms. The trench 401 may then be filled with oxide 408, e.g., using LPCVD and high density plasma. The oxide 408 may then be etched back leaving a trench of width A with thick oxide block substantially filling the lower portion of the trench as shown in FIG. 4B.

Figure 4C:
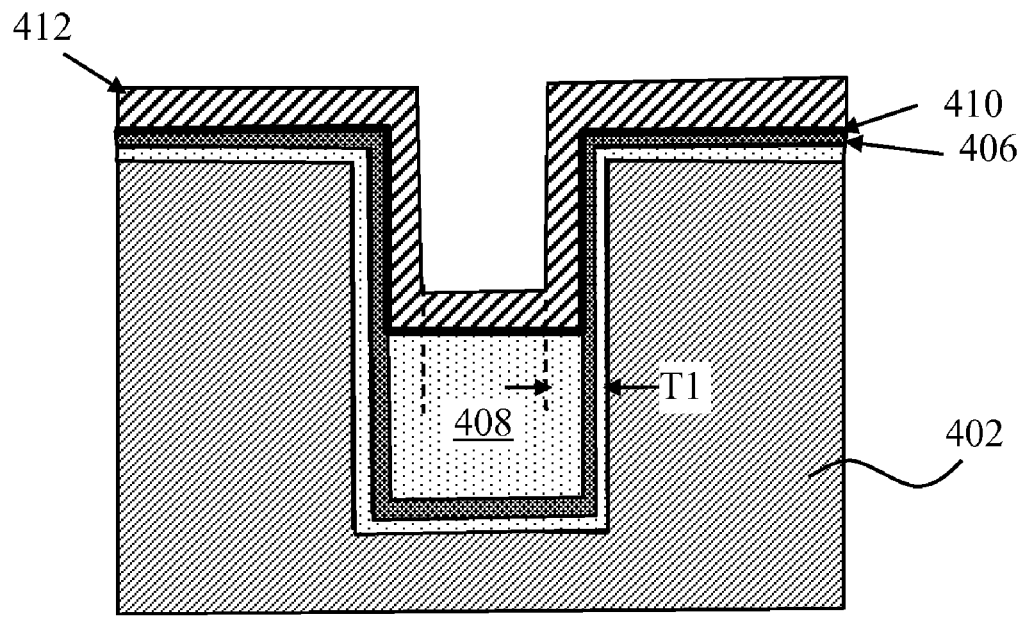
Figure 4D:
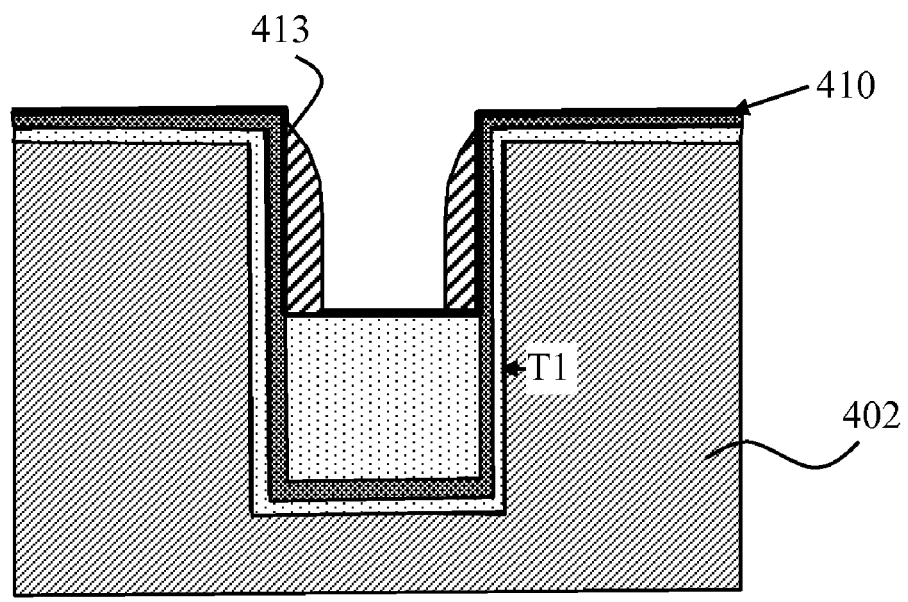

A thin oxide layer 410 (e.g., a high temperature oxide (HTO)) may optionally be deposited on top of the oxide 408, on the sidewall of the trench 401 and on top of the nitride 406 as shown in FIG. 4C. The thickness of the oxide 410 may be between about 50 Angstroms and 500 Angstroms. Conductive material, such as doped polysilicon 412 may then be deposited on top of the oxide 410 (or on the nitride 406 if the oxide 410 is not used). The thickness of the poly 412 depends on the desired bottom oxide sidewall thickness T1, which may be between about 500 Å and about 5000 Å. The poly 412 may then be anisotropically etched back to form the poly spacers 413 as shown in FIG. 4D.

Figure 4E:
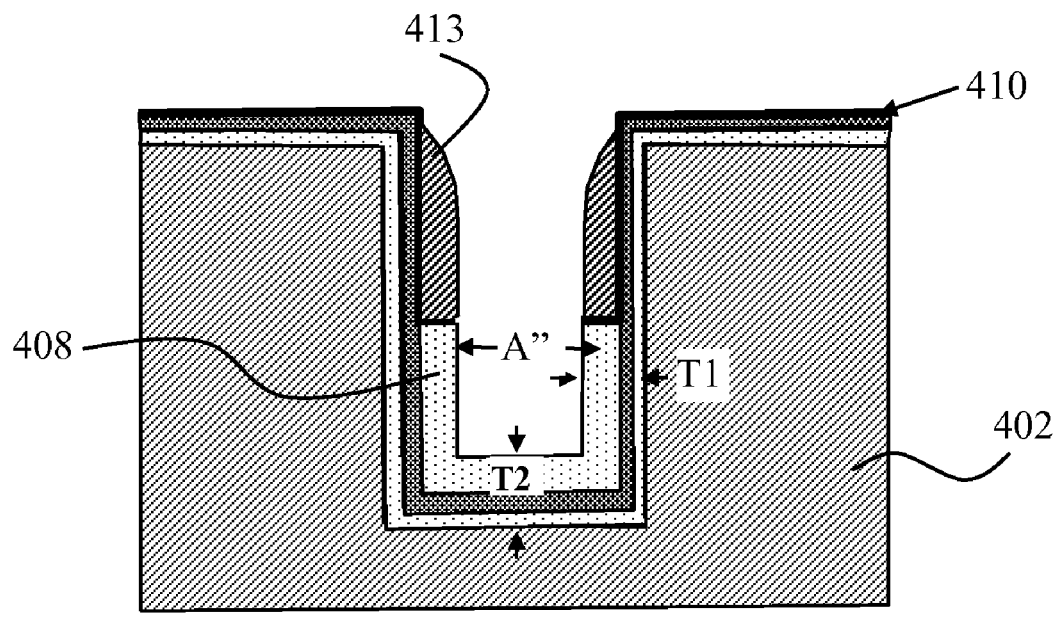
Figure 4F:
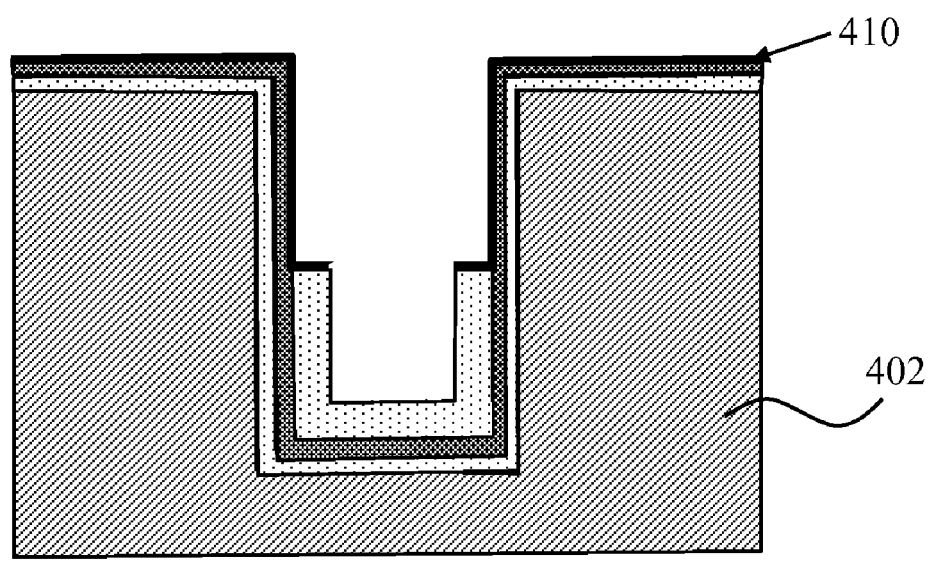

The oxide 408 is then anisotropically etched to a desired thickness T2 at the bottom as shown in FIG. 4E. The thickness of T2 may be between about 500 Å and about 5000 Å. The polysilicon that forms the spacers 413 is preferably resistant to the etch process used to anisotropically etch the oxide 408. The thickness of the poly spacer 413 on the sidewalls of the trench determines the thickness T1 therefore determines the width A" of a trench etched into the oxide 408 by the anisotropic etch process. After etching, the spacer 413 may be removed as shown in FIG. 4F. The "aspect ratio" is effectively enlarged over the top portion of trench for easier gap fill than if a thick oxide were uniformly formed on the bottom and sidewalls of the trench. It is further noted that the bottom thickness T2 may be determined independently of the sidewall thickness T1 by simply varying the duration of the anisotropic etch. In general, it is desirable to form T2>T1.

Figure 4G:
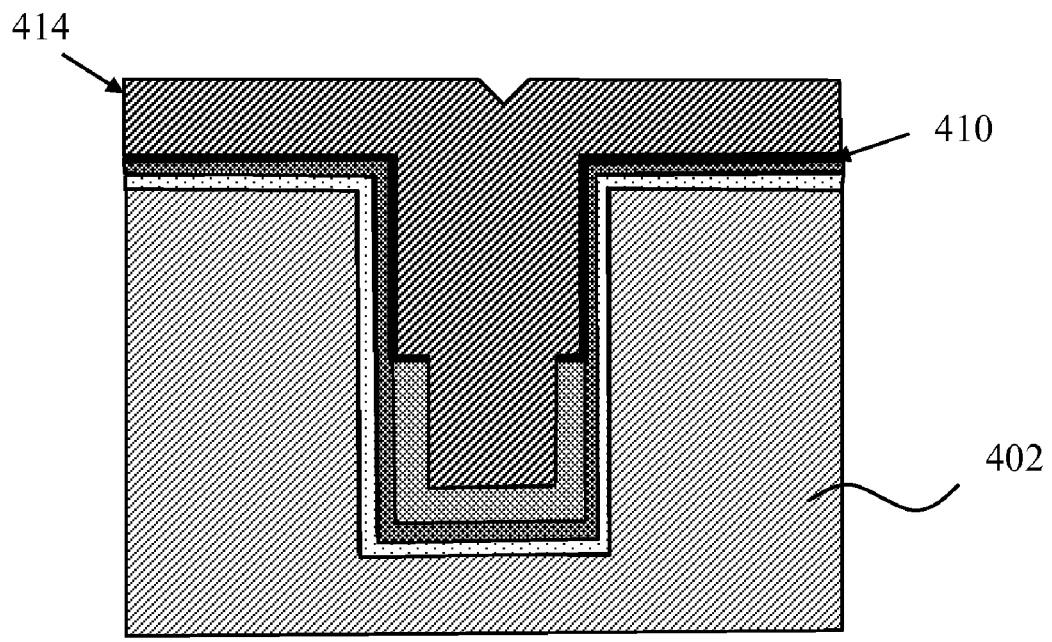
Figure 4H:
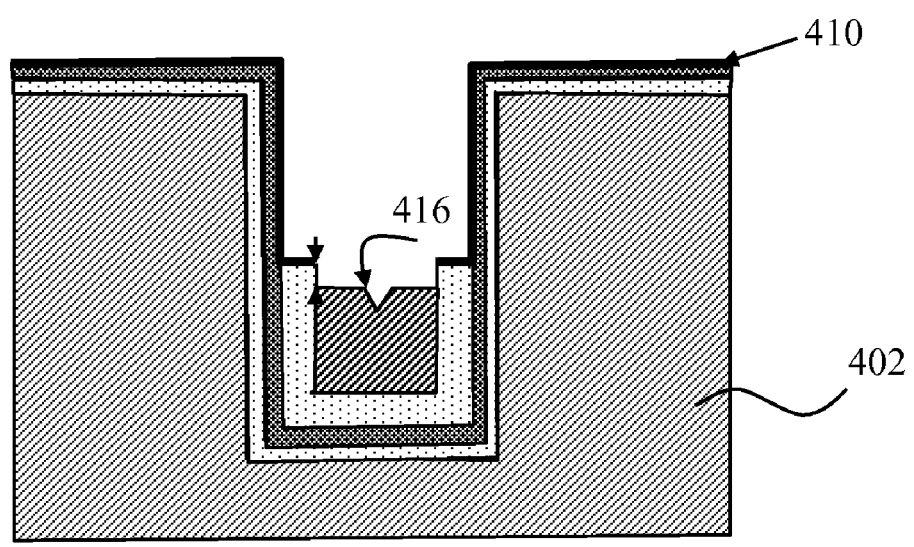
Figure 4I:
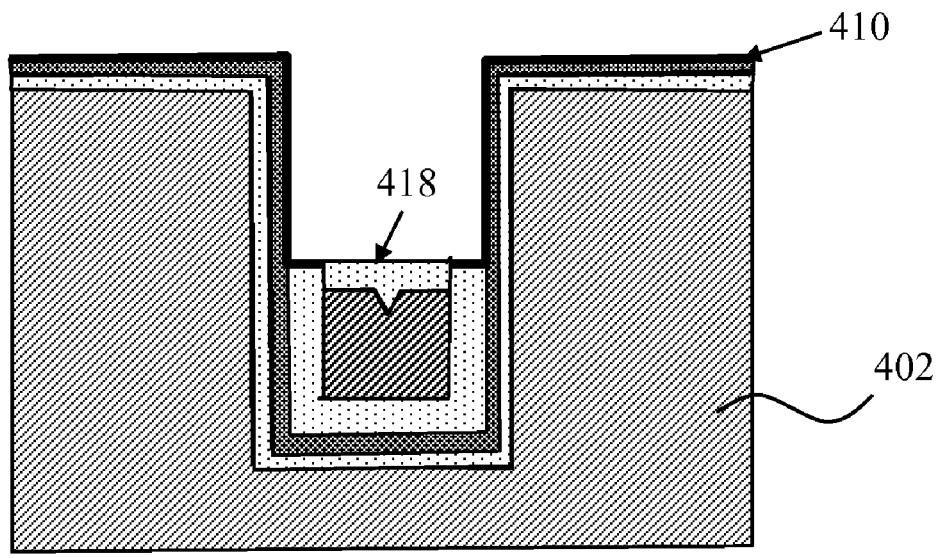

Conductive material, such as polysilicon 414 may be deposited to fill the trench in the oxide 408 as shown in FIG. 4G. The polysilicon 414 may then be etched back to below the top surface of the thick oxide 408, e.g., by about 1000 Angstroms to 2000 Angstroms to form a gap 416 as shown in FIG. 4H. The remaining polysilicon 414 may act as a shield electrode for the finished device. An insulator, such as poly reoxidation (reox) 418 may be formed to fill the gap 416 as shown in FIG. 4I. The thickness of the poly reoxidation 418 may be about 2000 Angstroms to 3000 Angstroms. As the upper portion and the top surface is covered by nitride layer 406, no oxidation occurs in there area.

Figure 4J:
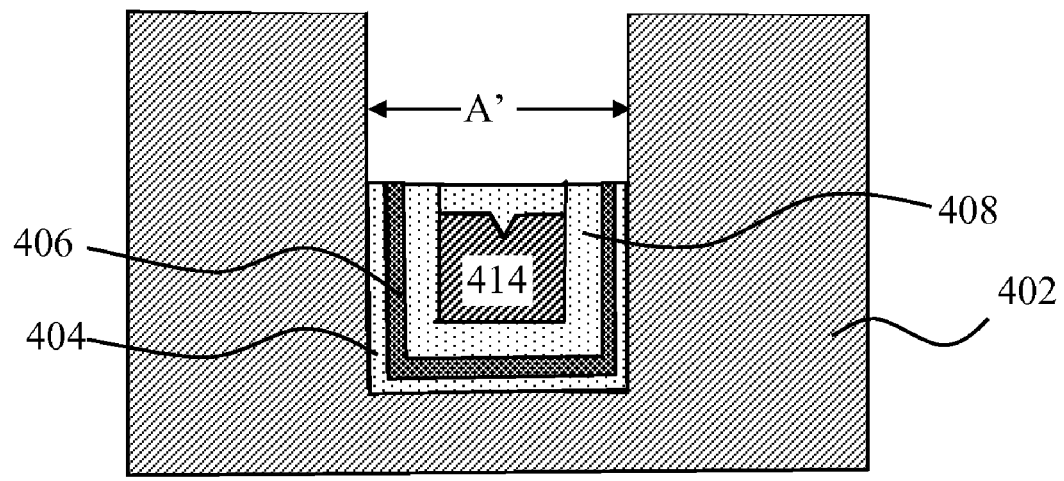

The optional thin oxide 410 may be etched following by etching off the exposed portions of nitride 406 and oxide 404 as shown in FIG. 4J.

Figure 4K:
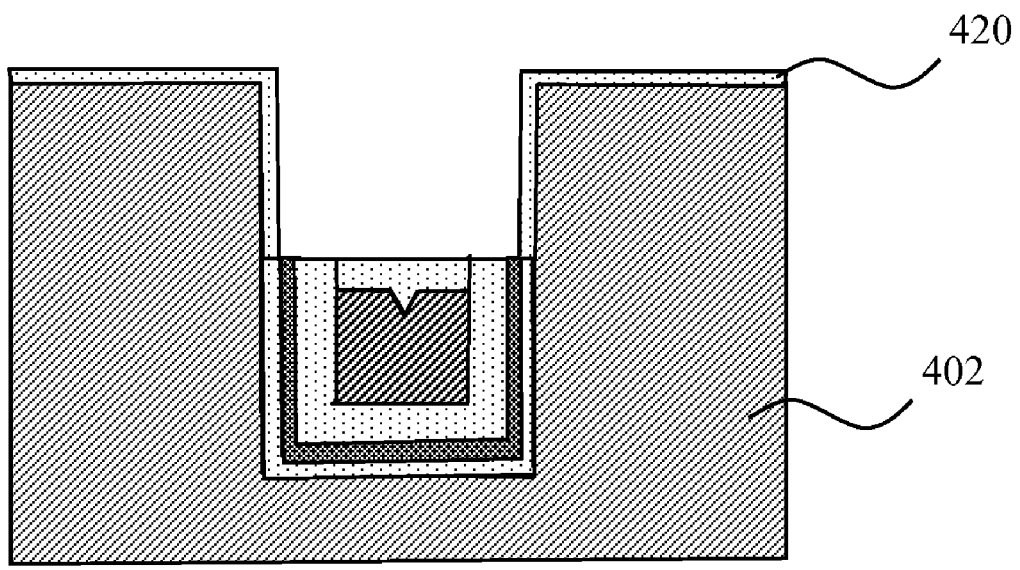
Figure 4L:
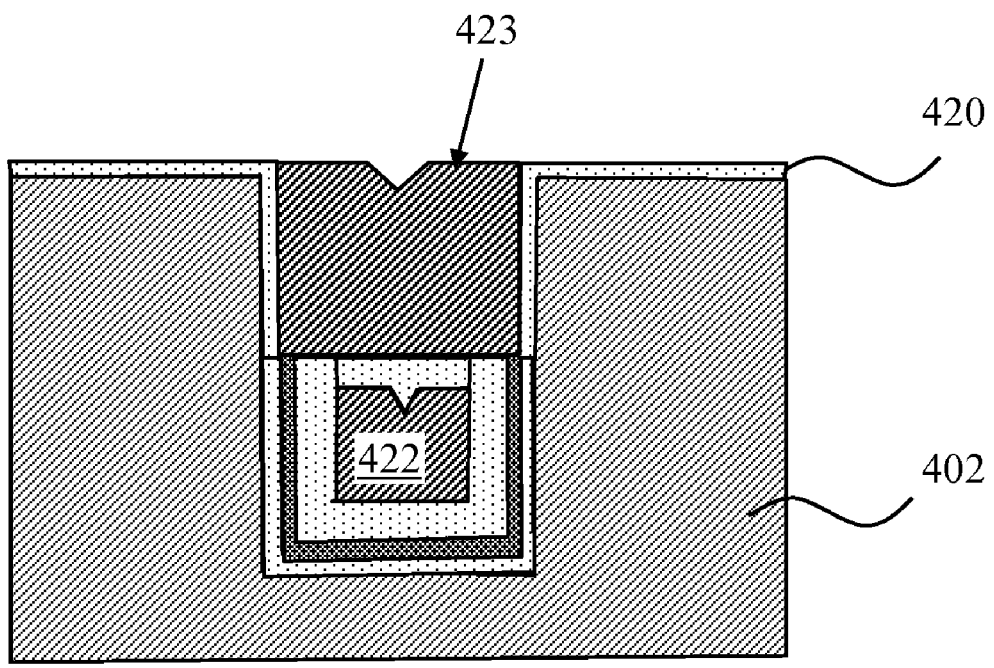

Gate oxide 420 may then be grown on the sidewall of the trench and on top of the semiconductor layer 402 as shown in FIG. 4K. Finally, conductive material, such as doped polysilicon 423 may be deposited to fill the top portion of the trench 401 and then etched back to form an active gate as shown in FIG. 4L. The thickness of the gate oxide 420 on the sidewalls of the top portion of the trench 401 determines a width A' of a top portion of the active gate that is formed by the polysilicon 423. In general gate oxide 420 is much thinner than T1 and T2, in the range of tens to hundreds of Angstroms. Further the top surface of poly 423 may be recessed below oxide layer 420.

Figure 4M:
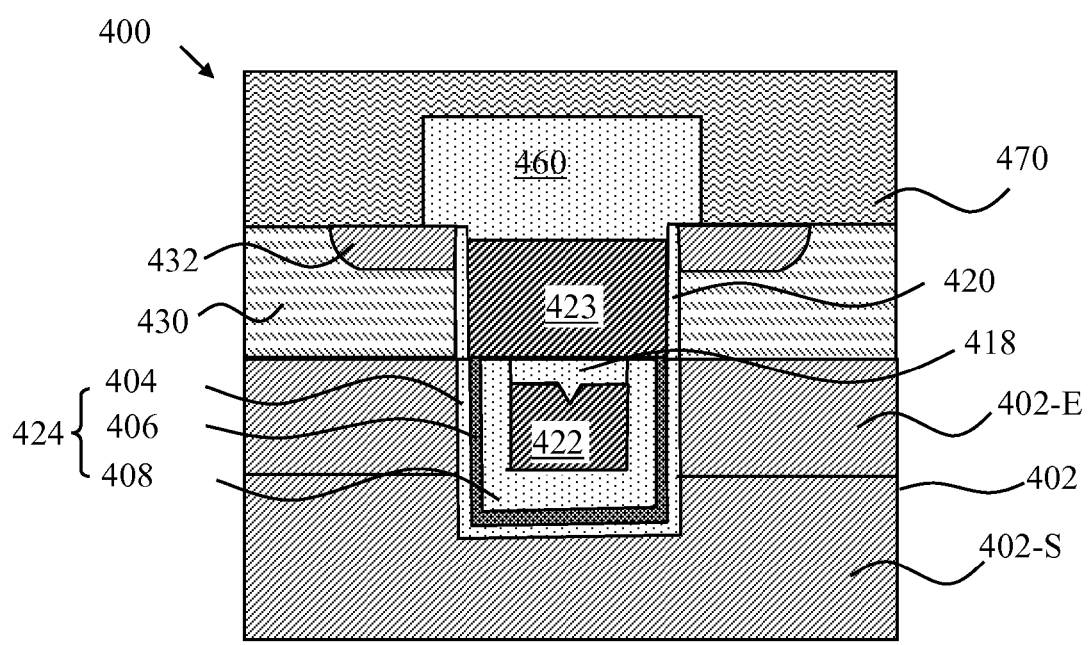

The fabrication of the device may continue with standard processes to implant body regions 430 and source regions 432, followed by the formation of a thick dielectric layer 460 on top of the surface and open contact holes through dielectric layer 460 for depositing a source metal 470 to electrically connect to the source and body regions. The device 400 resulting from this process as shown in FIG. 4M is constructed on a substrate 402 which comprising a lightly doped Epitaxial layer 402-E overlaying a heavily doped substrate layer 402-S. In the embodiment shown in FIG. 4M, gate trench 401 extends from the top surface of Epitaxial layer 402-E through the entire 402-E layer reach into substrate layer 402-S. Alternatively the bottom of trench 401 may stop within Epitaxial layer 402-E without reaching substrate layer 402-S (not shown). The trench 401 has a poly gate electrode 423 disposed in the upper portion of the trench and a poly shielding electrode 422 disposed in the lower portion of the trench with an inter poly dielectric layer 418 in between insulating the two. To optimize the shielding effect, the bottom shielding electrode may electrically connect through layout arrangement to the source metal layer 470 where a ground potential is usually applied in applications. A thin gate oxide layer 420 insulates the gate electrode from the source and body regions in the upper portion of trench. To minimize the gate to drain capacitance of the device therefore to improve the device switching speed and efficiency, body regions 430 is carefully controlled to diffuse to substantially the bottom of gate electrode 423 to effectively reduce the coupling between gate 423 and drain region disposed below the body regions. The bottom shielding (or source) electrode 422 is surrounded by a thick dielectric layer 424 along the lower sidewalls and the bottom of trench to insulate from the drain region. Preferably the dielectric layer 424 is much thicker than the thin gate oxide layer 420 and has a variable thickness that is T2 on the trench bottom and T1 on trench sidewalls, whereas T1<T2. As shown in FIG. 4M, dielectric layer 424 may further comprise a nitride layer 406 sandwiched between oxide layers 404 and 408.

Figure 2:
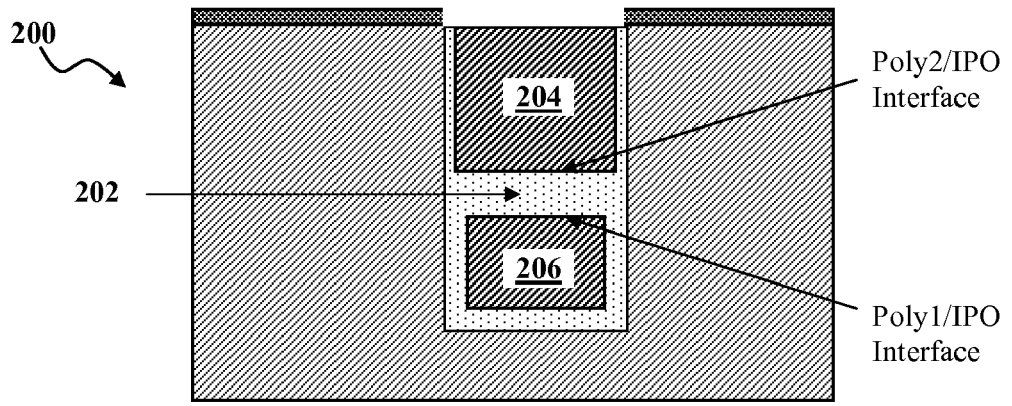
FIG. 2 is a cross-sectional schematic diagram of a trench gate including an inter-poly oxide (IPO) between Poly1 and Poly2 of the prior art.

FIGS. 5A-5F illustrate another alternative process of fabricating a trench DMOS with variable-thickness gate oxides for a shield poly gate of the type depicted in FIG. 2 according to an embodiment of the present invention.

Figure 5A:
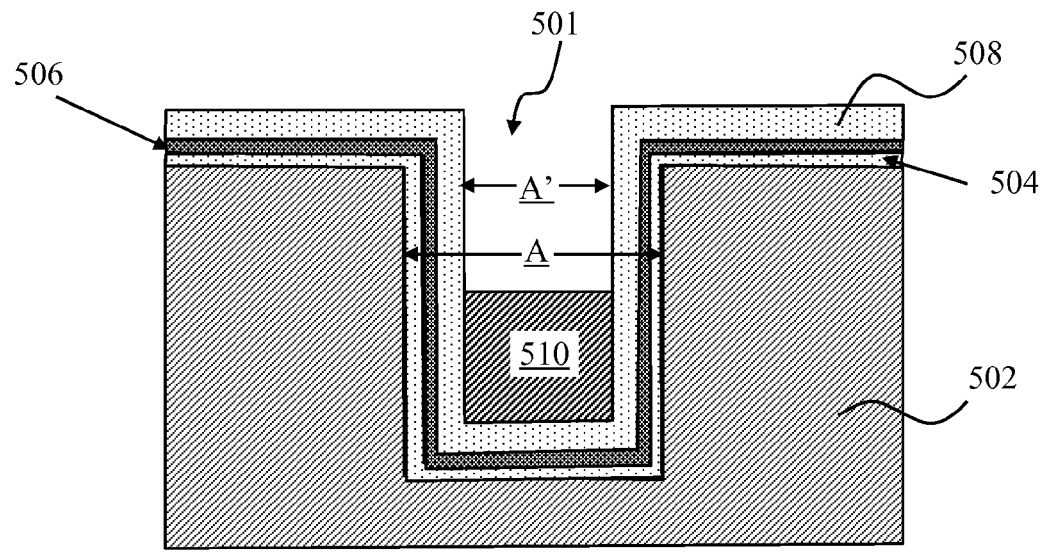
FIGS. 5A-5F are cross-sectional views illustrating an alternative process of fabricating a trench DMOS with variable-thickness gate trench oxides for shield poly gate case according to an embodiment of the present invention.

As shown in FIG. 5A, a trench 501 of width A is formed in a semiconductor layer 502. A thin insulator layer such as an oxide layer 504 is grown or deposited on the surfaces of the trench 501 and on the top surface of the semiconductor layer 502. A thickness of the oxide 504 may be about 450 Angstroms. A layer of material such as a nitride 506 is then deposited, e.g., to a thickness between about 50 Angstroms and about 500 angstroms, on top of the oxide 504 followed by deposition of another oxide, e.g., HTO (high temperature oxide) oxide 508, on top of the nitride 506. The thickness of the nitride 506 may be about 100 Angstroms and the thickness of the HTO oxide 508 may be about 800 Angstroms. In this example, the combined thickness of the oxide 504, nitride 506 and HTO oxide 508 determines a width A' of a narrowed trench 501. In-situ doped polysilicon 510 may then be deposited into the narrowed trench 501 and then etched back to a predetermined thickness of, e.g., between about 500 Å and about 2 nm to form a shield electrode. Arsenic may be optionally implanted into at least an upper portion of the polysilicon 510 remaining in the trench to enhance a reoxidation rate of the polysilicon in a subsequent oxidation step.

Figure 5B:
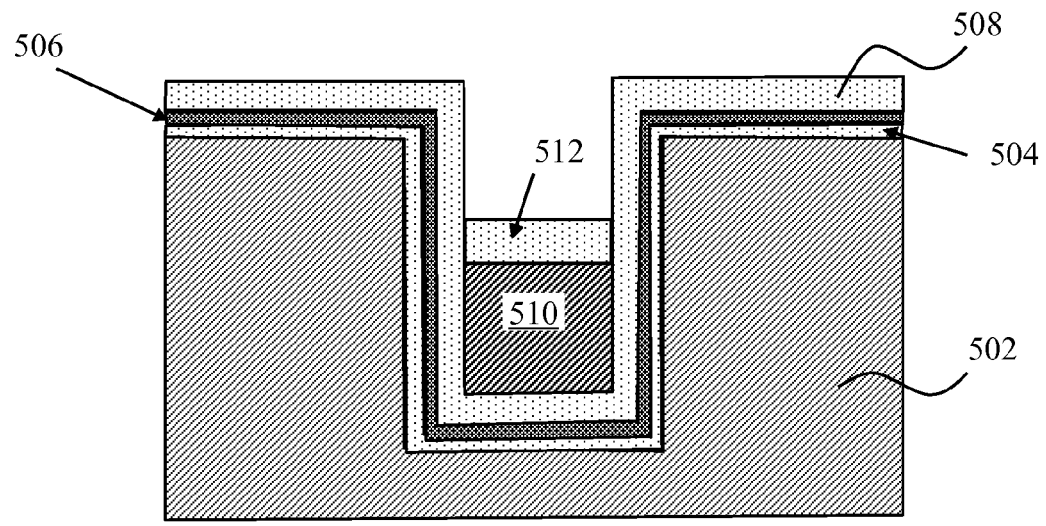
Figure 5C:
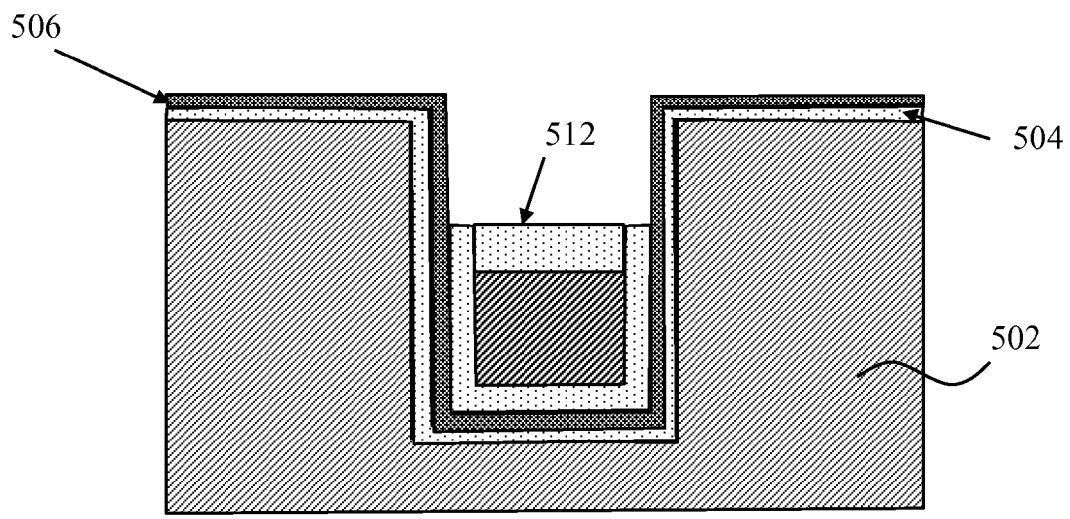
Figure 5D:
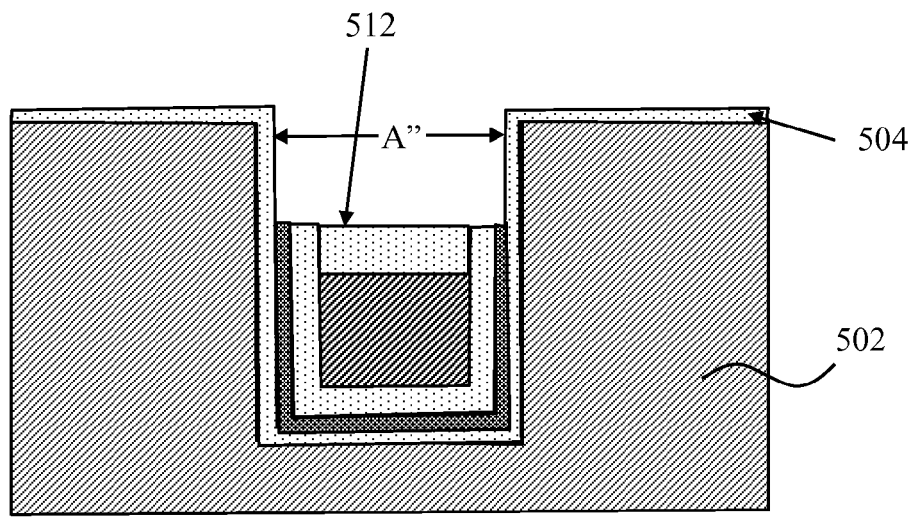

Specifically, as shown in FIG. 5B, an insulator such as a poly reox layer 512 may be formed by growing oxide on top of the polysilicon 510. The thickness of the poly reox 512 may be about 3000 Angstroms. The nitride layer 506 ensures that oxide layer 512 is only grown on top of the polysilicon 510. The HTO oxide 508 may then be removed by an etch process that stops on the nitride layer 506 as shown in FIG. 5C. This protects the underlying oxide 504 from the etch process that removes the thicker HTO oxide 508. The nitride 506 may then be removed leaving an upper portion of the trench with a width A" that is wider than A' as shown in FIG. 5D. In this example, the width A" of the upper portion is determined by the thickness of the thin oxide 504 on the sidewalls of the trench. The thickness uniformity of the inter-poly oxide 512 across the wafer may be improved by use of a thermal oxide. This is because a thermal oxide process oxidizes the top portion of the poly in the trench as opposed to depositing and etching back the oxide on the poly in the trench.

The oxide can be preserved during the nitride removal process due to high nitride to oxide wet etch selectivity.

Figure 5E:
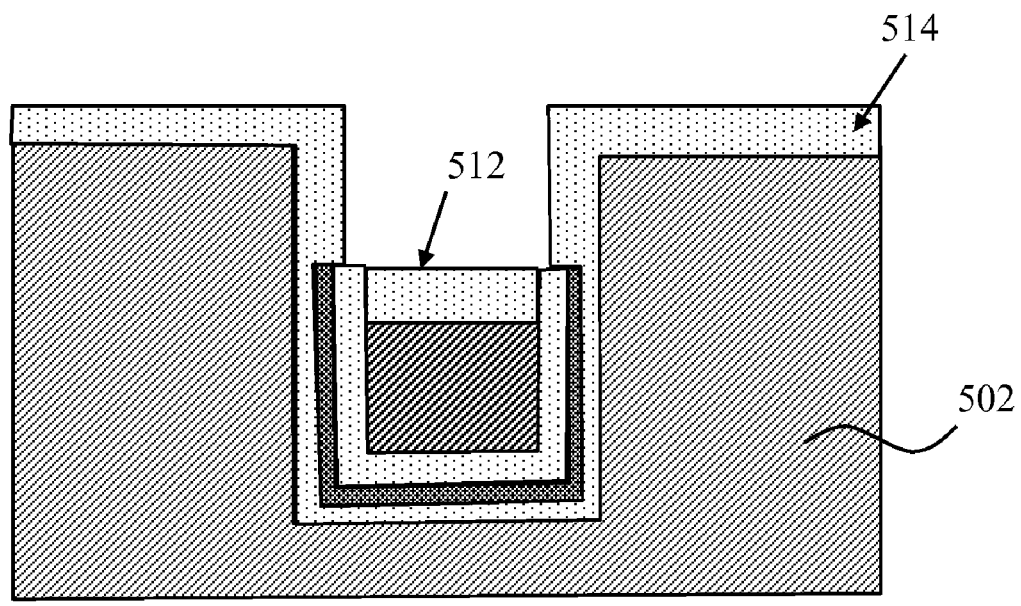
Figure 5F:
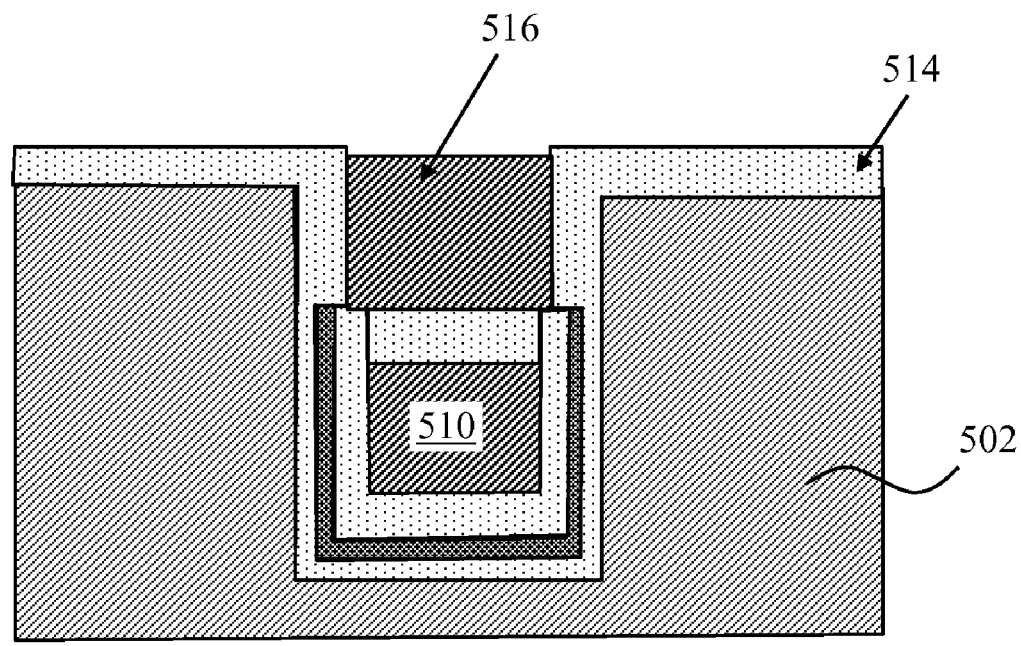

Gate oxide 514 may then be formed (e.g., by growth or deposition) on the thin oxide 504 as shown in FIG. 5E. The thickness of the gate oxide 514 may be about 450 Angstroms. Alternatively, the thin oxide 504 may first be removed before growing the gate oxide 514. Finally, a second conductive material, such as doped polysilicon 516, may be deposited into the remaining portions of the trench over the gate oxide 514. The polysilicon 516 may be etched back to form a shield gate structure, in which the polysilicon 516 is the gate electrode and the polysilicon 510 is the shield electrode.

It should be clear to those skilled in the art that in the embodiments described above, only a single mask—an initial mask used to define the gate trenches—is required in the formation of the gate trench, gate trench oxides, gate poly, and shield poly.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for fabricating a semiconductor device comprising:
a) forming a trench in the semiconductor layer; b) forming an oxide-nitride-oxide (ONO) structure on a sidewall and at a bottom of the trench, wherein the ONO structure includes a nitride layer between first and second oxide layers, wherein forming the ONO structure includes forming a first oxide layer on the sidewall and at the bottom of the trench and on top of the semiconductor layer; forming a nitride layer on top of the first oxide layer; and forming a second oxide layer on top of the nitride layer; and c) forming one or more conductive structures in a portion of the trench not occupied by the ONO structure, wherein the one or more conductive structures include a shield gate structure having an insulating material sandwiched between a first conductive structure and a second conductive structure, wherein forming the second oxide layer includes: filling the trench with the second oxide layer; etching back the second oxide layer to leave a portion of the second oxide at the bottom of the trench; forming a spacer layer with the predetermined thickness T1 on the second oxide layer and on the sidewalls of the remaining portions of the trench; anisotropically etching the spacer layer to form one or more spacers on the sidewall; anisotropically etching the second oxide layer to a non-zero thickness T2 at the bottom of the trench; and removing the one or more spacers.

2. The method of claim 1 wherein c) comprises:
filling the trench with the first conductive structure; etching back the first conductive structure to below a top surface of the second oxide layer; forming a reoxidation layer on top of the first conductive structure; removing the first oxide layer, the nitride layer and the third oxide layer exposed at the sidewall of the trench and at the top of the semiconductor layer; forming a gate oxide at the sidewall of the trench and at the top of the semiconductor layer; and filling the remaining of the trench with the second conductive structure and etching back the second conductive structure.

3. The method of claim 1 wherein c) comprises:
filling a portion at the bottom of the trench with the first conductive structure;
forming a reoxidation layer on top of the first conductive structure in the trench;
removing the second oxide and the nitride layer exposed in the trench;
forming a gate oxide on the sidewall of the trench; and
filling a remaining portion of the trench with the second conductive structure and etching back the second conductive structure.

4. The method of claim 1 further comprising: d) forming a first polysilicon region on the ONO at the bottom of the trench, wherein the top of the first polysilicon region is below the top of the trench; e) growing an inter polysilicon oxide (IPO) on top of the first polysilicon region; f) removing the top portions of the ONO, wherein a part of the IPO still remains after this step; g) forming a gate dielectric on the remaining sidewalls of the trench; and h) filling the remaining portions of the trench with a gate electrode to form a shield gate trench.

5. The method of claim 4 further comprising, before e): implanting the top of the first polysilicon region to improve said growing IPO.

6. A method for fabricating a semiconductor device comprising:
a) forming a first trench of width A in a semiconductor layer; b) filling the first trench with an insulating material; c) removing selected portions of the insulating material leaving a remaining portion of the insulating material on a bottom surface and sidewalls of the first trench; d) forming one or more spacers with a predetermined thickness T1 on one or more sidewalls of a remaining portion of the first trench; e) anisotropically etching the remaining portion of the insulating material using the one or more spacers as a mask to form a second trench in the insulating material having a predetermined thickness T2 at a bottom thereof and a width A' determined by the thickness T1 of the spacers, wherein A' is less than A, wherein some of the insulating material remains on the bottom surface and sidewalls of the first trench after said anisotropically etching the remaining portion of the insulating material; f) removing the spacers leaving the remaining portion of the first trench in the semiconductor layer with a width A" that is greater than A'; and g) filling at least the second trench in the insulating material with a conductive material.

7. The method of claim 6 further comprising, before step b):
forming a first oxide layer on the sidewall and at the bottom of the trench; and
forming a nitride layer on top of the first oxide layer.

8. The method of claim 7, wherein d) further comprises:
forming a polysilicon layer with the predetermined thickness T1 on top of said nitride layer; and
anisotropically etching the polysilicon layer to form the spacers.

9. The method of claim 8 further comprising, after g):
etching back the conductive material to below a top surface of the insulating material in the trench to form a shield electrode;
forming an insulating layer on top of the conductive material in the trench;
removing the first oxide layer and the nitride layer exposed at the sidewall of the trench and at the top of the semiconductor layer;
forming an gate dielectric layer on the sidewall of the trench and at the top of the semiconductor layer; and
filling the remaining portion of the trench with another conductive material and etching back the conductive material to form a gate electrode.

10. The method of claim 6, wherein d) further includes:
forming a nitride layer with the predetermined thickness T1 on the sidewall of the remaining portion of the first trench, on top of the insulating material deposited in the trench and on top of the semiconductor layer; and
anisotropically etching the nitride layer to form the one or more spacers.

11. The method of claim 10, wherein d) further includes before said forming a nitride layer, forming a first oxide layer at least on the sidewall of the remaining portion of the first trench.

12. The method of claim 10, further comprising, before g): forming a dielectric layer on the sidewall of the remaining portion of the first trench to serve as a gate dielectric; wherein g) further comprises filling at least a portion of the first trench with the conductive material.

13. The method of claim 12 further comprising, after g): etching back the conductive material.

14. The method of claim 12 further comprising: filling an opening in the conductive material with an additional insulating material; and etching back the additional insulating material and the conductive material.

* * * * *